(12) United States Patent
Chen et al.

(10) Patent No.: US 9,698,014 B2
(45) Date of Patent: Jul. 4, 2017

(54) PHOTORESIST COMPOSITION TO REDUCE PHOTORESIST PATTERN COLLAPSE

(71) Applicant: Taiwan Semiconductor Manufacturing Co., Ltd, Hsin-Chu (TW)

(72) Inventors: Tsung-Pao Chen, Taichung (TW); Sheng-Min Chuang, Taichung (TW); Teng-Kuei Chuang, Taichung (TW)

(73) Assignee: TAIWAN SEMICONDUCTOR MANUFACTURING CO., LTD, Hsin-Chu (TW)

( * ) Notice: Subject to any disclaimer, the term of this patent is extended or adjusted under 35 U.S.C. 154(b) by 0 days.

(21) Appl. No.: 14/447,078

(22) Filed: Jul. 30, 2014

(65) Prior Publication Data

US 2016/0033863 A1    Feb. 4, 2016

(51) Int. Cl.
| | |
|---|---|
| G03F 7/039 | (2006.01) |
| G03F 7/038 | (2006.01) |
| G03F 7/32 | (2006.01) |
| G03F 7/20 | (2006.01) |
| H01L 21/027 | (2006.01) |
| H01L 21/311 | (2006.01) |
| H01L 21/3213 | (2006.01) |
| G03F 7/004 | (2006.01) |
| G03F 7/023 | (2006.01) |
| G03F 7/40 | (2006.01) |

(52) U.S. Cl.
CPC ........ *H01L 21/0274* (2013.01); *G03F 7/0046* (2013.01); *G03F 7/0233* (2013.01); *G03F 7/0236* (2013.01); *G03F 7/0392* (2013.01); *G03F 7/0395* (2013.01); *G03F 7/0397* (2013.01); *G03F 7/322* (2013.01); *G03F 7/40* (2013.01); *H01L 21/31144* (2013.01); *H01L 21/32139* (2013.01)

(58) Field of Classification Search
None
See application file for complete search history.

(56) References Cited

U.S. PATENT DOCUMENTS

| | | | | |
|---|---|---|---|---|
| 3,402,044 | A | * | 9/1968 | Steinhoff ............... C23F 1/02 430/191 |
| 4,009,033 | A | * | 2/1977 | Bakos et al. ............... 430/191 |
| 4,863,827 | A | * | 9/1989 | Jain et al. ............... 430/145 |
| 5,604,077 | A | * | 2/1997 | Kono ............... C08G 8/08 430/191 |
| 6,103,447 | A | * | 8/2000 | Chen et al. ............... 430/270.1 |

(Continued)

FOREIGN PATENT DOCUMENTS

| | | | |
|---|---|---|---|
| GB | 2046461 | * | 12/1980 |
| JP | 55-130538 | * | 10/1980 |

(Continued)

*Primary Examiner* — Martin Angebranndt
(74) *Attorney, Agent, or Firm* — Birch, Stewart, Kolasch & Birch, LLP (57) ABSTRACT

A photoresist composition and a method for forming a patterned photoresist, and a method for forming an integrated circuit pattern are provided. A photoresist composition is provided. The photoresist composition includes a first polymer, a second polymer; and a solvent. The first polymer is more soluble than the second polymer in an aqueous solution, and the first polymer has a higher etching resistance than the second polymer.

20 Claims, 7 Drawing Sheets

(56) References Cited

U.S. PATENT DOCUMENTS

| | | | |
|---|---|---|---|
| 6,303,264 B1 * | 10/2001 | Fujie et al. | 430/270.1 |
| 6,423,463 B1 * | 7/2002 | Oota et al. | 430/191 |
| 6,593,058 B1 * | 7/2003 | Feiring et al. | 430/270.1 |
| 6,605,413 B1 | 8/2003 | Lyons et al. | |
| 7,326,510 B2 * | 2/2008 | Gogolides et al. | 430/270.1 |
| 8,703,395 B2 * | 4/2014 | Namai et al. | 430/315 |
| 8,703,404 B2 * | 4/2014 | Hatakeyama et al. | 430/322 |
| 8,828,493 B2 * | 9/2014 | Cheng et al. | 427/259 |
| 2003/0003402 A1 | 1/2003 | Plat | |
| 2005/0245094 A1 | 11/2005 | Brodsky et al. | |
| 2006/0057507 A1 | 3/2006 | Chang et al. | |
| 2006/0246377 A1 * | 11/2006 | Yamato et al. | 430/311 |
| 2008/0063976 A1 | 3/2008 | Chang | |
| 2008/0118860 A1 * | 5/2008 | Harada et al. | 430/270.1 |
| 2008/0203322 A1 | 8/2008 | Lin et al. | |
| 2010/0028802 A1 * | 2/2010 | Konno | G03F 7/091 430/270.1 |
| 2011/0147985 A1 * | 6/2011 | Cheng et al. | 264/225 |
| 2012/0006788 A1 * | 1/2012 | Fujimori | C08F 20/50 216/41 |
| 2012/0219902 A1 * | 8/2012 | Bae et al. | 430/270.1 |
| 2013/0196481 A1 | 8/2013 | Lee et al. | |

FOREIGN PATENT DOCUMENTS

| | | | |
|---|---|---|---|
| JP | 62-277746 | * | 12/1987 |
| JP | 11-024246 | * | 1/1999 |
| JP | 2001-215696 | * | 8/2001 |
| JP | 2005-309451 | * | 11/2005 |
| WO | 2008/044326 | * | 4/2008 |

* cited by examiner

PHOTORESIST COMPOSITION TO REDUCE PHOTORESIST PATTERN COLLAPSE

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Photolithography employs photoresist to create a patterned structure that protects the underlying surface from subsequent fabrication steps, such as chemical etching. There are two types of photoresists in common use, positive photoresists and negative photoresists. The positive photoresists are sensitized when exposed to ultraviolet light so that exposed areas will dissolve in a developer solution leaving behind unexposed areas. The negative photoresists are hardened by exposure to ultraviolet light so exposed areas are inhibited from being dissolved by the developer solution while unexposed areas are dissolved.

Although existing photoresist have been generally adequate for their intended purpose, they have not been entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some variations of the embodiments are described. Throughout the various views and illustrative embodiments, like reference numbers are used to designate like elements. It is understood that additional operations can be provided before, during, and after the method, and some of the operations described can be replaced or eliminated for other embodiments of the method.

Embodiments for a photoresist composition and a method for forming a patterned photoresist, and a method for forming an integrated circuit pattern are provided.

A photoresist layer is formed on a material layer, and it is used in a photolithography process to define the patterns of the material layer. However, during the development or rinse process, the problem of pattern collapse in the photoresist layer may occur due to capillary force. If there is poor adhesion between the photoresist layer and material layer, the photoresist layer may peel off of the material layer. If the mechanical strength of the photoresist layer is inappropriate, the photoresist layer may break or bend.

The disclosure provides the photoresist composition to resolve the pattern collapse problem of the photoresist layer.

FIG. 1A-1H show cross-sectional representations of various stages of forming an integrated circuit pattern, in accordance with some embodiments of the disclosure.

Figure 1A:
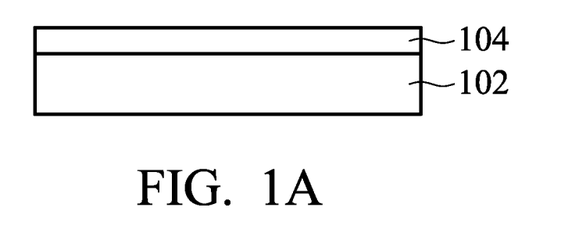
FIG. 1A-1H show cross-sectional representations of various stages of forming an integrated circuit pattern, in accordance with some embodiments of the disclosure.

Referring to FIG. 1A, a material layer 104 is formed on a substrate 102. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

The material layer 104 is designed to form specific patterns. In some embodiments, the material layer 104 is a dielectric layer. In some embodiments, the material layer 104 is a metal layer. In order to form the specific patterns, a photolithoghy process is performed. The photolithography process includes photoresist coating (e.g., spin-on coating), soft baking, mask aligning, exposure, post-exposure baking, developing the photoresist, rinsing, drying (e.g., hard baking), or other suitable processes. The photolithography process will be described in detail later.

Figure 1B:
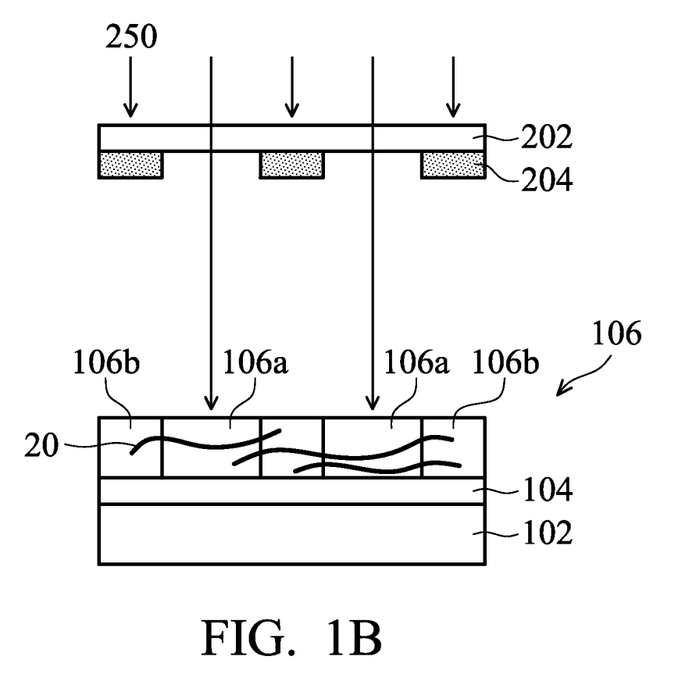

After forming the material layer 104, a photoresist layer 106 is formed on the material layer 104, as shown in FIG. 1B, in accordance with some embodiments of the disclosure.

In some embodiments, the photoresist layer 106 is a positive photoresist. The positive photoresist is sensitized when exposed to light so that exposed regions will dissolve in a developer solution leaving behind unexposed regions.

The photoresist layer 106 is formed by deposition a polymer composition on the material layer 104. The polymer composition includes a first polymer (not shown), a second polymer 20 and a solvent. A weight ratio of the second polymer 20 to the first polymer is in a range from about 0.01% to about 5%. If the weight ratio is greater than 5%, the second polymer may not be removed completely after the etching process (as shown in FIG. 1F). If the weight ratio is smaller than 0.01%, the mechanical strength of the second polymer may not be enough to support two adjacent photoresist patterns.

The solvent may include heptanone, propylene glycol methyl ether acetate, ethyl lactate, or propylene glycol methyl ether.

It should be noted that the first polymer (such as a photoreactive polymer) is more soluble after exposure than the second polymer 20 (such as a photostable polymer) in an aqueous solution. Therefore, when the polymer composition is immersed into the aqueous solution, the first polymer is dissolved but the second polymer 20 is not dissolved. Furthermore, the first polymer has a higher etching resistance than the second polymer 20. In other words, the first polymer has a lower etching rate for an etching process than the second polymer 20. Therefore, when the polymer composition is etched, the first polymer is more durable than the second polymer 20.

In some embodiments, the first polymer has a first Ohnishi parameter, the second polymer 20 has a second Ohnishi parameter, and the first Ohnishi parameter is smaller than or equal to the second Ohnishi parameter. The Ohnishi parameter is defined as a value of $N/(Nc-Nx)$ of the polymer (N: total number of atoms of the polymer; Nc: number of carbon atoms of monomer unit; Nx: number of atoms besides carbon atoms of the polymer). A smaller value of $N/(Nc-Nx)$ provides a lower etching rate. Therefore, the first Ohnishi parameter being smaller than or equal to the second Ohnishi parameter means that the first polymer has a lower etching rate than the second polymer. In other words, the first polymer has a higher etching durability.

In some embodiments, the first polymer has a first ring parameter, the second polymer has a second ring parameter, and the first ring parameter is larger than or equal to the second ring parameter. The ring parameter is defined as a value of Mcr/Mtot (Mcr: the mass of carbon atoms contained in a phenyl-ring structure of the polymer; Mtot: the total mass of the polymer). A higher value of Mcr/Mtot provides a lower etching rate. In other words, a higher value of Mcr/Mtot provides a higher etching resistance of the polymer. Therefore, the first ring parameter is larger than or equal to the second ring parameter means that the first polymer has a lower etching rate than the second polymer. In other words, the first polymer has a higher etching durability.

As mentioned above, the ring parameter and the Ohnishi parameter are used to determine the etching durability of the first polymer and the second polymer 20. If the first polymer or the second polymer 20 has a phenyl-ring structure, the ring parameters of the first polymer and the second polymer 20 are calculated to determine the etching durability. If the first polymer and the second polymer 20 do not have a phenyl-ring structure, the Ohnishi parameters of the first polymer and the second polymer 20 are calculated to determine the etching durability.

The first polymer includes novolac resin, polyhydroxystyrene (PHS), poly(4-t-butoxycarbonyloxystyrene) (PBOCST), poly(2-methyl-2-adamantyl methacrylate-co-γ-butyrolactone methacrylate) (MAMA-GBLMA), or poly(norbornene fluoroalcohol-co-tetrafluoroethylene-co-tert butyl acrylate) (NB—F—OH-TFE-t-BuAc). The second polymer includes polyethylene (PE), polypropylene (PP) or polytetrafluoroethylene (PTFE).

In some embodiments, the first polymer is novolac resin, and the second polymer is polyethylene (PE). In some other embodiments, the first polymer is polyhydroxystyrene (PHS), and the second polymer is polyethylene (PE).

In some embodiments, the first polymer is poly(2-methyl-2-adamantyl methacrylate-co-γ-butyrolactone methacrylate) (MAMA-GBLMA), and the second polymer is polypropylene (PP).

In some other embodiments, the first polymer is poly(norbornene fluoroalcohol-co-tetrafluoroethylene-co-tert butyl acrylate) (NB—F—OH-TFE-t-BuAc), and the second polymer is polytetrafluoroethylene (PTFE).

In addition, the polymer composition further includes a photo acid generator. The photo acid generator includes diazonaphthoquinone (DNQ), triphenylsulfonium hexafluoroantimonate (TPSHFA), or hexafluoroantimonate. When the photoresist composition is exposed to a radiation beam 250 (shown in FIG. 1B), acid is generated by the photo acid generator.

Referring to FIG. 1B again, after the photoresist layer 106 is formed on the material layer 104, the photoresist layer 106 is exposed to the radiation beam 250 shown through a mask 202. The mask 202 includes blocking portions 204 that do not allow the radiation beam 250 to pass through. The pattern of the mask 202 is transferred to the photoresist layer 106. Therefore, the photoresist layer 106 is patterned and includes an exposed region 106a and unexposed regions 106b.

The radiation beam 250 may be ultra-violet (UV) or extreme ultra-violet (EUV), such as a 248 nm beam from a Krypton Fluoride (KrF) excimer laser, a 193 nm beam from an Argon Fluoride (ArF) excimer laser, or a 157 nm beam from a fluorine ($F_2$) excimer laser.

Figure 1C:
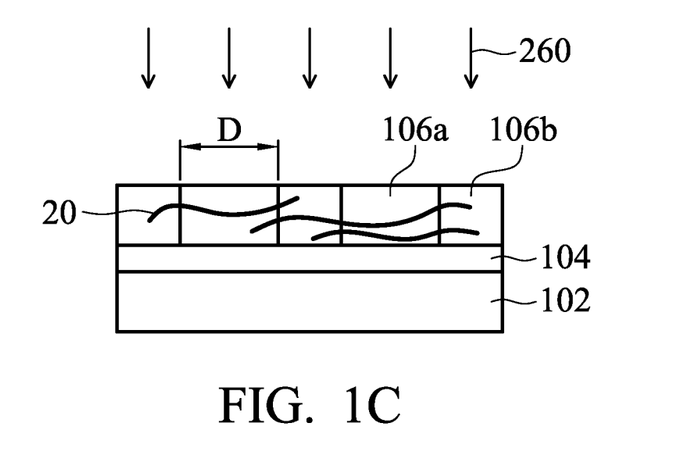

After the photoresist layer 106 is exposed by the radiation beam 250, the photoresist layer 106 is baked by a heat 260 as shown in FIG. 1C in accordance with some embodiments of the disclosure. The function of baking is to decompose the photoreactive polymer in the photoresist layer 106 and to evaporate solvent. In some embodiments, a post exposure bake (PEB) operation is performed on the photoresist layer 106.

Figure 1D:
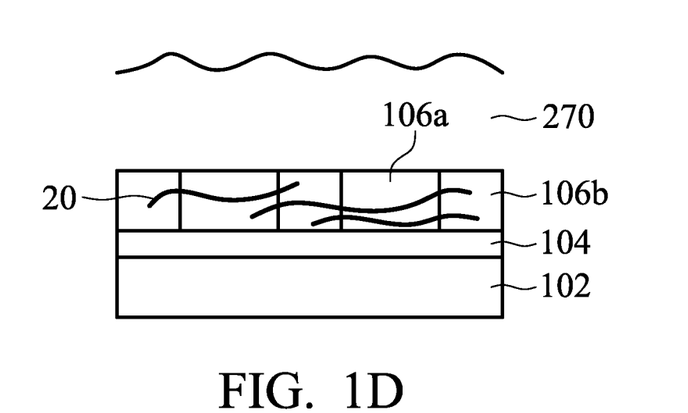

After the photoresist layer 106 is baked by the heat 260, the photoresist layer 106 is exposed to a developer solution 270 as shown in FIG. 1D in accordance with some embodiments of the disclosure. The developer solution 270 is used to dissolve the exposed regions 106a of the photoresist layer 106.

The developer solution 270 is an aqueous solution. In some embodiments, the developer solution 270 is tetramethylammonium hydroxide (TMAH) solution. In some other embodiments, the developer solution 270 is sodium hydroxide (NaOH) solution. The exposure time of the photoresist layer 106 to the developer solution 270 may be dependent on the composition of the developer solution 270.

The developer solution 270 further includes a surfactant such as an alkali anionic surfactant, an anionic phosphate surfactant, or a non-ionic surfactant. The developer solution 270 may be applied using a number of methods. In some embodiments, the substrate 102 is dipped into a developer solution bath. In some other embodiments, the developer solution 270 is sprayed into the photoresist layer 106.

It should be noted that the second polymer 20 is chosen to have a lower solubility to the aqueous solution than the first polymer. Therefore, when the photoresist layer 106 is exposed to a developer solution 270, the first polymer is removed, but the second polymer 20 remains in the photoresist layer 106. As shown in FIG. 1C, the second polymer 20 crosses and connects two adjacent unexposed regions 106b. Therefore, the problem of collapse in the photoresist layer 106 is reduced or avoided by increasing the mechanical strength of the unexposed regions 106b of the photoresist layer 106.

In order to cross two adjacent unexposed regions 106b, the length of the second polymer 20 should be designed. In some embodiments, the second polymer 20 has a theoretical length L represented by Equation (I):

$$L = N*d*\sin(\theta/2)  \quad \text{Equation (I)}$$

N: the total number of carbon bonds in the second polymer 20;
D: a length of a single carbon-carbon bond;
θ: 109 degrees for the single carbon-carbon bond.

It should be noted that the patterned photoresist 106 has a number of patterns (the unexposed regions 106b), and the theoretical length L is larger than or equal to a distance between two adjacent patterns. As shown in FIG. 1C, a distance D is formed between two adjacent unexposed regions 106 of the photoresist layer 106. Therefore, the theoretical length L of the second polymer 20 is greater than or equal to the distance D.

In some other embodiments, the second polymer 20 has a practical radius r represented by Equation (II):

$$r = d\sqrt{N}  \quad \text{Equation (II)}$$

d: a length of the single carbon-carbon bond;
N: total number of carbon bonds in the second polymer.

It should be noted that the patterned photoresist 106 has a number of patterns (the unexposed regions 106b), and the practical radius r of the second polymer 20 is greater than or equal to the distance D between two adjacent patterns.

Figure 1E:
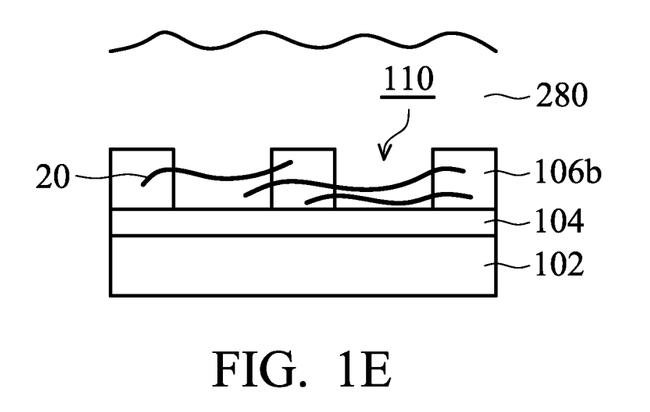
Figure 1F:
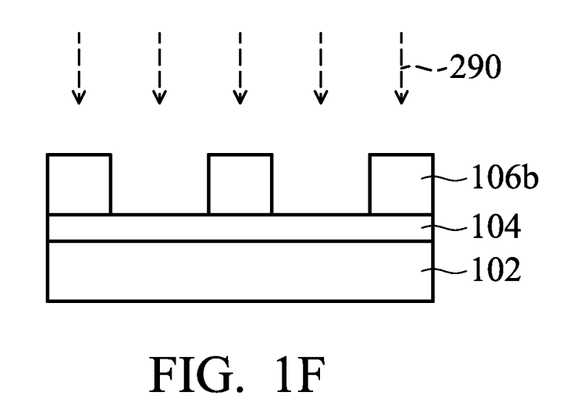

After the photoresist layer 106 is exposed to a developer solution 270, the remaining photoresist layer 106 is exposed to a rinse solution 280 as shown in FIG. 1E in accordance with some embodiments of the disclosure. The remaining photoresist layer 106 is rinsed with the rinse solution 280 to stop the developing reaction and remove the developer solution 270. In some embodiments, the rinse solution 280 is ionized water.

Afterwards, the substrate 102 is then dried to remove the rinse solution 280 and so that two adjacent exposed regions 106b of the photoresist layer 106 do not collapse and a gap 110 remains therebetween. In some embodiments, the substrate 102 is dried by a spin drying method.

Afterwards, the material layer 104 is etched by an etching process 290 as shown in FIG. 1F in accordance with some embodiments of the disclosure. The material layer 104 is etched by using the photoresist layer 106 as a mask. In some embodiments, the etching process is a dry etching process, such as a plasma etching process.

Figure 1G:
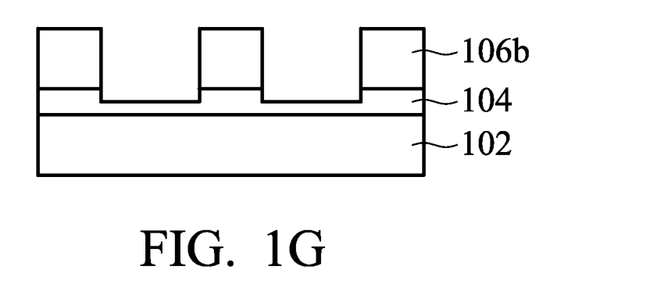

Afterwards, the material layer 104 is etched as shown in FIG. 1G in accordance with some embodiments of the disclosure. As mentioned above, the first polymer has a higher etching resistance than the second polymer. Therefore, the remaining second polymer 20 is removed by the etching process 290.

Figure 1H:
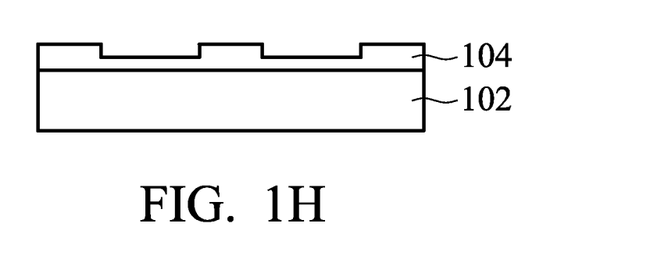

After the material layer 104 is etched, the unexposed region 106b of the photoresist layer 106 is removed as shown in FIG. 1H in accordance with some embodiments of the disclosure.

Figure 2:
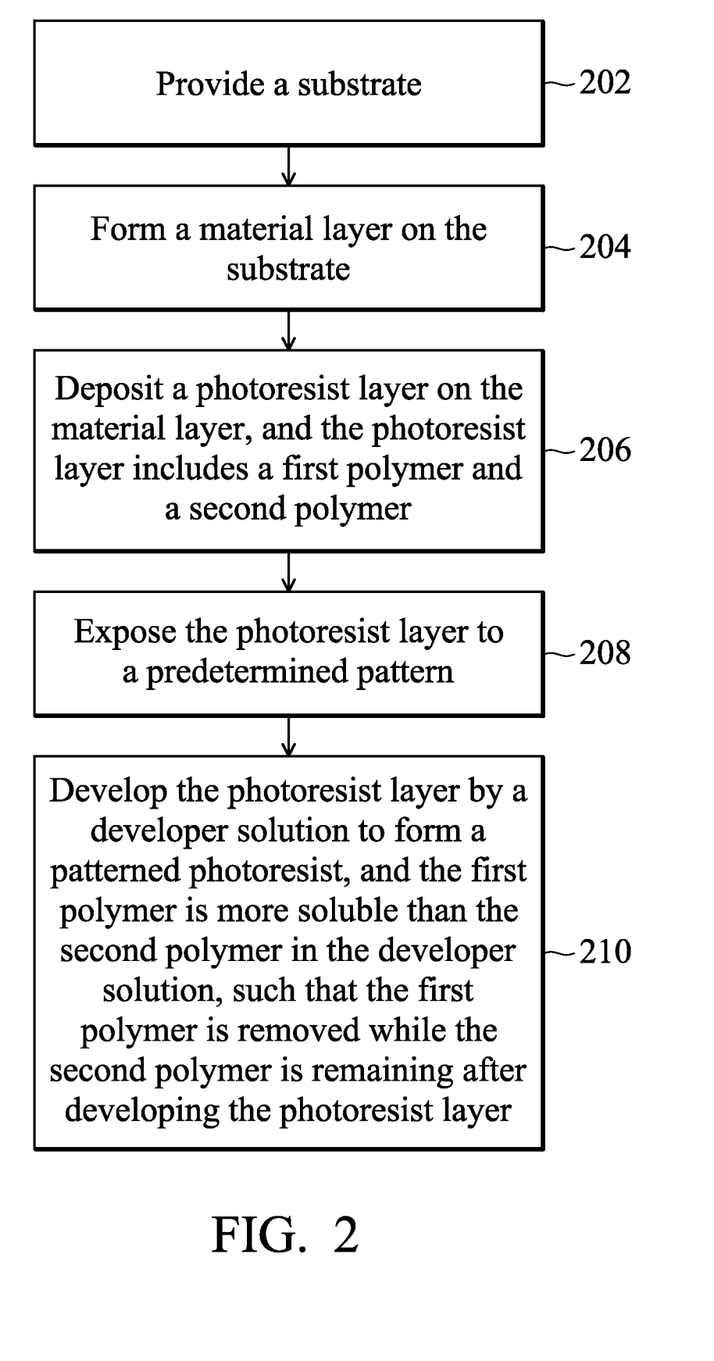
FIG. 2 shows a flow-chart of a method for forming a patterned photoresist, in accordance with some embodiments.

FIG. 2 shows a flow-chart of a method for forming a patterned photoresist, in accordance with some embodiments.

In operation 202, a substrate is provided. In some embodiments, the substrate 102 is provided as shown in FIG. 1A.

In operation 204, a material layer is formed on the substrate. In some embodiments, the material layer 104 is formed on the substrate 102 as shown in FIG. 1B.

In operation 206, a photoresist layer is deposited on the material layer. In some embodiments, the photoresist layer 106 is deposited on the material layer 104. The photoresist layer 106 is formed by deposition a polymer composition on the material layer 104. The polymer composition includes a first polymer, a second polymer and a solvent. A weight ratio of the second polymer to the first polymer is in a range from about 0.01% to about 5%. In addition, the polymer composition includes a photo acid generator.

It should be noted that the first polymer (such as a photoreactive polymer) is more soluble than the second polymer (such as a photostable polymer) in an aqueous solution. Therefore, when the polymer composition is immersed into the aqueous solution, the first polymer is dissolved but the second polymer is not dissolved. Furthermore, the first polymer has a higher etching resistance than the second polymer. In other words, the first polymer has a lower etching rate for an etching process than the second polymer. Therefore, when the polymer composition is etched, the first polymer is more durable than the second polymer.

In operation 208, the photoresist layer is exposed to a predetermined pattern. In some embodiments, the photoresist layer 106 is exposed to the radiation beam 250 shown through the mask 202 as shown in FIG. 1B. The mask 202 includes blocking portions 204 that do not allow the radiation beam 250 to pass through. The pattern of the mask 202 is transferred to the photoresist layer 106.

In operation 210, the photoresist layer is developed by a developer solution to form a patterned photoresist layer. In some embodiments, the photoresist layer 106 is exposed to the developer solution 270 as shown in FIG. 1D. The developer solution 270 is an aqueous solution. In some embodiments, the developer solution 270 is tetramethylammonium hydroxide (TMAH) solution. In some other embodiments, the developer solution 270 is sodium hydroxide (NaOH) solution.

After the developing, the patterned photoresist layer 106 with the unexposed regions 106b is obtained as shown in FIG. 1F. The unexposed regions 106b are used as patterns to define an underlying material layer 104.

Figure 3:
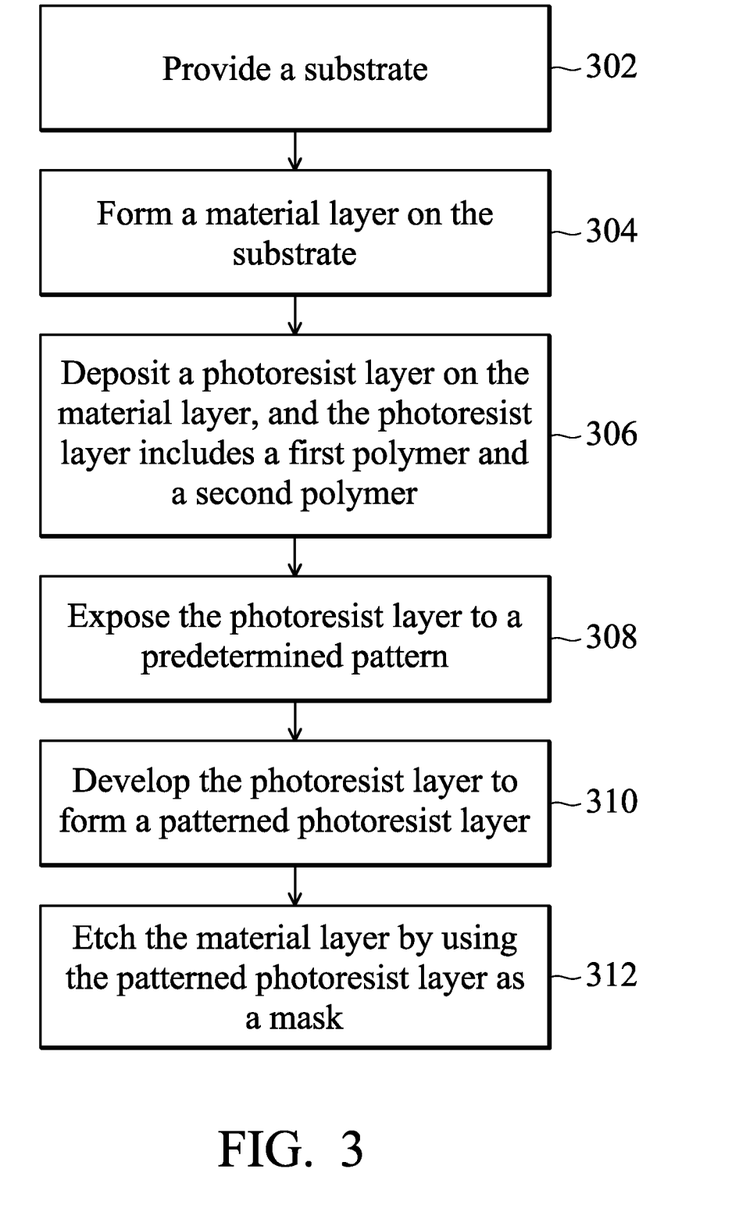
FIG. 3 shows a flow-chart of a method for forming an integrated circuit pattern, in accordance with some embodiments.

FIG. 3 shows a flow-chart of a method for forming an integrated circuit pattern, in accordance with some embodiments. In operation 302, a substrate is provided. In some embodiments, the substrate 102 is provided as shown in FIG. 1A.

In operation 304, a material layer is formed on the substrate. In some embodiments, the material layer 104 is formed on the substrate 102 as shown in FIG. 1B.

In operation 306, a photoresist layer is deposited on the material layer. In some embodiments, the photoresist layer 106 is deposited on the material layer 104. The photoresist layer 106 is formed by deposition a polymer composition on the material layer 104. The polymer composition includes a first polymer, a second polymer and a solvent. A weight ratio of the second polymer to the first polymer is in a range from about 0.01% to about 5%.

It should be noted that the first polymer is more soluble than the second polymer in an aqueous solution. Therefore, when the polymer composition is immersed into the aqueous solution, the first polymer is dissolved but the second polymer is not dissolved. Furthermore, the first polymer has a higher etching resistance than the second polymer. In other words, the first polymer has a lower etching rate for an etching process than the second polymer. Therefore, when the polymer composition is etched, the first polymer is more durable than the second polymer.

In operation 308, the photoresist layer is exposed to a predetermined pattern. In some embodiments, the photoresist layer 106 is exposed to the to the radiation beam 250 shown through the mask 202 as shown in FIG. 1B. The mask 202 includes blocking portions 204 that do not allow the radiation beam 250 to pass through. The pattern of the mask 202 is transferred to the photoresist layer 106. In some embodiments, the photoresist layer 106 is exposed by utilizing Kyrpton Fluoride (KrF) excimer laser, Argon Fluoride (ArF) excimer laser, fluorine ($F_2$) excimer laser or extreme ultraviolet (EUV).

Before operation 310, a baking process is performed to the photoresist layer. In some embodiments, the photoresist layer 106 is baked with heat 260 as shown in FIG. 1C.

In operation 310, the photoresist layer is developed by a developer solution to form a patterned photoresist layer. In some embodiments, the photoresist layer 106 is exposed to the developer solution 270 as shown in FIG. 1D. The developer solution 270 is an aqueous solution. In some embodiments, the developer solution 270 is tetramethylammonium hydroxide (TMAH) solution. In some other embodiments, the developer solution 270 is sodium hydroxide (NaOH) solution.

After applying the developer solution on the photoresist layer 106, the photoresist layer 106 is rinsed by applying the rinse solution 280 on the photoresist layer 106 as shown in FIG. 1E.

In operation 312, the material layer 104 is etched by using the patterned photoresist layer as a mask. In some embodiments, the material layer 104 is etched by using the patterned photoresist layer 106 as the mask as shown in FIG. 1G. Afterwards, when the photoresist layer 106 is removed, an integrated circuit pattern is obtained.

Figure 4:
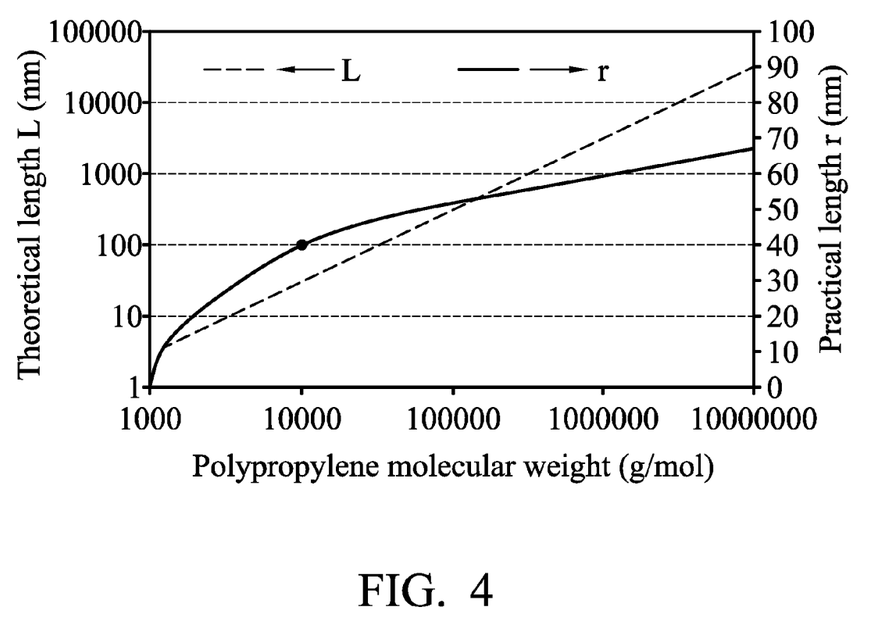
FIG. 4 shows a plot illustrating the relationship between the length and the molecular weight of the second polymer, in accordance with some embodiments.

FIG. 4 shows a plot illustrating the relationship between the length and the molecular weight of the second polymer 20, in accordance with some embodiments. As shown in FIG. 4, the second polymer 20 is polypropylene (PP).

The x-axis shows the molecular weight of the polypropylene (PP). The left Y-axis shows the theoretical length L of the polypropylene (PP), and the right Y-axis shows the practical radius r of the polypropylene (PP). The dashed line in FIG. 4 shows the relationship between the theoretical length L and molecular weight of the polypropylene (PP). The solid line in FIG. 4 shows the relationship between the practical radius r and molecular weight of the polypropylene (PP).

The critical dimension (CD) defines dimensions of the smallest geometrical features (width of interconnect line, contacts, trenches, etc.) which can be formed during semiconductor device/circuit manufacturing using given technology. Therefore, the CD value is used to define the distance between two adjacent photoresist patterns.

As mentioned above, the theoretical length L is greater than or equal to the distance between two adjacent patterns of the photoresist layer. The theoretical length L is represented by the above Equation (I). For example, if a critical dimension (CD) value of the photoresist layer is 10 nm, the theoretical length L should be larger than 10 nm. As shown by the dashed line, the molecular weight of the polypropylene (PP) should be larger than 5000 (g/mol) to meet the 10 nm of theoretical length requirement.

Alternatively, the practical radius r is larger than or equal to the distance between two adjacent patterns of the photoresist layer. The practical radius r is represented by the above Equation (II). For example, if the critical dimension (CD) value of the photoresist layer is 40 nm, the practical radius r should be larger than 40 nm. As shown by the solid line, the molecular weight of the polypropylene (PP) should be larger than 10000 (g/mol) to meet the 40 nm of practical radius requirement.

EMBODIMENTS

Embodiment 1

In Embodiment 1, the first polymer is poly phenol formaldehyde having a chemical Formula (I), the second polymer is polyethylene (PE), and the solvent is propylene glycol methyl ether acetate. The weight ratio of the second polymer to the first polymer is in a range from about 0.01% to about 5%.

(Formula I)

The ring parameter of the poly-phenol formaldehyde is 0.68 (72/106=0.68). The ring parameter of the polyethylene (PE) is 0. Therefore, the ring parameter of the first polymer is larger than that of the second polymer.

Embodiment 2

In Embodiment 1, the first polymer is polyhydroxystyrene (PHS) having a chemical formula (II), the second polymer is polyethylene (PE), and the solvent is propylene glycol methyl ether acetate. The weight ratio of the second polymer to the first polymer is in a range from about 0.01% to about 5%.

(Formula II)

The ring parameter of the polyhydroxystyrene (PHS) is 0.6 (72/120). The ring parameter of the polyethylene (PE) is 0. Therefore, the ring parameter of the first polymer is larger than that of the second polymer.

Embodiment 3

In Embodiment 3, the first polymer is poly(2-methyl-2-adamantyl methacrylate-co-γ-butyrolactone methacrylate) (MAMA-GBLMA) having a formula (III), the second polymer is polypropylene (PP), and the solvent is propylene glycol methyl ether acetate. The weight ratio of the second polymer to the first polymer is in a range from about 0.01% to about 5%.

(Formula III)

The Ohnishi parameter of MAMA-GBLMA is 3 (39/(15−2)=3). The Ohnishi parameter of polypropylene (PP) is 3 (9/3=3). Therefore, the Ohnishi parameter of the first polymer is equal to that of the second polymer.

Embodiment 4

In Embodiment 4, the first polymer is poly (norbornene fluoroalcohol-co-tetrafluoroethylene-co-tert butyl acrylate)

(NB—F—OH-TFE-t-BuAc) having a formula (IV), the second polymer is polytetrafluoroethylene (PTFE), and the solvent is propylene glycol methyl ether acetate. The weight ratio of the second polymer to the first polymer is in a range from about 0.01% to about 5%.

(Formula IV)

The Ohnishi parameter of the first polymer is 9.7 (58/(20−4−10)=9.7). The Ohnishi parameter of polytetrafluoroethylene (PTFE) is ∞ (6/0=∞). Therefore, the Ohnishi parameter of the first polymer is smaller than that of the second polymer.

Embodiments of a photoresist composition, a method for forming a patterned photoresist, and a method for forming an integrated circuit pattern are provided. The photoresist layer is formed on a material layer. The photoresist layer is formed by a polymer composition which includes a first polymer and a second polymer. The first polymer is more soluble than the second polymer in an aqueous solution, and the first polymer has a higher etching resistance than the second polymer. Therefore, the first polymer is removed while the second polymer remains after developing the photoresist layer. The second polymer is used to crosses and connects two adjacent photoresist patterns, and therefore the mechanical strength of the photoresist layer is improved. The problem of collapse in the photoresist layer is reduced or avoided by improving the mechanical strength of the photoresist layer.

In some embodiments, a photoresist composition is provided. The photoresist composition includes a first polymer, a second polymer; and a solvent. The first polymer is more soluble than the second polymer in an aqueous solution, and the first polymer has a higher etching resistance than the second polymer.

In some embodiments, a method for forming a patterned photoresist is provided. The method includes providing a substrate and forming a material layer on the substrate. The method also includes depositing a photoresist layer on the material layer, and the photoresist layer includes a first polymer and a second polymer. The method further includes exposing the photoresist layer to a predetermined pattern and developing the photoresist layer by a developer solution to form a patterned photoresist. The first polymer is more soluble than the second polymer in the developer solution, such that the first polymer is removed while the second polymer remains after developing the photoresist layer.

In some embodiments, a method for forming an integrated circuit pattern is provided. The method includes providing a substrate and forming a material layer on the substrate. The method also includes depositing a photoresist layer on the material layer. The photoresist layer includes a first polymer and a second polymer, the first polymer is more soluble than the second polymer in aqueous solution, and the first polymer has a higher etching resistance than the second polymer. The method further includes exposing the photoresist layer to a predetermined pattern. The method also includes developing the photoresist layer to form a patterned photoresist layer and etching the material layer by using the patterned photoresist layer as a mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A photoresist composition, comprising:
a combination of a first polymer and a second polymer, wherein the first polymer is poly (norbornene fluoroalcohol-co-tetrafluoroethylene-co-tert butyl acrylate) (NB—F—OH-TFE-t-BuAc) and the second polymer is polytetrafluoroethylene (PTFE);
a solvent, wherein the first polymer is rendered more soluble in a developer by the action of a photo acid generator and is substantially dissolved in the developer while the second polymer is substantially not dissolved in the developer, and wherein the first polymer has a higher etching resistance than the second polymer; and
the photo acid generator.
2. The photoresist composition as claimed in claim 1, wherein the photo acid generator comprises diazonaphthoquinone (DNQ), triphenylsulfonium hexafluoroantimonate (TPSHFA), or hexafluoroantimonate.
3. The photoresist composition as claimed in claim 1, wherein a weight ratio of the second polymer to the first polymer is in a range from about 0.01% to about 5%.
4. The photoresist composition as claimed in claim 1, wherein the solvent comprises heptanone, propylene glycol methyl ether acetate, ethyl lactate, or propylene glycol methyl ether.
5. A method for forming a patterned photoresist, comprising:
providing a substrate;
forming a material layer on the substrate;
depositing a photoresist layer on the material layer, wherein the photoresist layer comprises a first polymer, a second polymer, a solvent and a photo acid generator, wherein the second polymer is polytetrafluoroethylene (PTFE) and has an actual length, and a weight ratio of the second polymer to the first polymer is in a range from about 0.01% to about 5%;
exposing the photoresist layer to a predetermined pattern to create a plurality of exposed regions and unexposed regions; and
developing the photoresist layer by a developer solution to form a patterned photoresist, wherein the first polymer in the exposed regions is more soluble than the second polymer in the developer solution, such that the first polymer in the exposed regions is removed while the second polymer in the exposed regions remains after developing the photoresist layer, and wherein the second polymer remaining in the exposed regions connects two adjacent unexposed regions,
wherein the patterned photoresist has a plurality of patterns and the actual length of the second polymer is greater than a distance between two adjacent patterns in said plurality of patterns.

6. The method for forming a patterned photoresist as claimed in claim 5, wherein the first polymer has a first ring parameter, the second polymer has a second ring parameter, and the first ring parameter is larger than or equal to the second ring parameter.

7. The method for forming a patterned photoresist as claimed in claim 5, wherein the first polymer has a first Ohnishi parameter, the second polymer has a second Ohnishi parameter, and the first Ohnishi parameter is smaller than or equal to the second Ohnishi parameter.

8. The method for forming an integrated circuit pattern as claimed in claim 5, wherein the first polymer comprises novolac resin, polyhydroxystyrene (PHS), poly(4-t-butoxycarbonyloxystyrene) (PBOCST), poly(2-methyl-2-adamantyl methacrylate-co-γ-butyrolactone methacrylate) (MAMA-GBLMA), or poly (norbornene fluoroalcohol-co-tetrafluoroethylene-co-tert butyl acrylate) (NB—F—OH-TFE-t-BuAc).

9. The method for forming a patterned photoresist as claimed in claim 5, wherein the solvent comprises heptanone, propylene glycol methyl ether acetate, ethyl lactate, or propylene glycol methyl ether.

10. The method for forming a patterned photoresist as claimed in claim 5, wherein exposing the photoresist layer to a predetermined pattern comprises:
utilizing Krypton Fluoride (KrF) excimer laser, Argon Fluoride (ArF) excimer laser, a fluorine (F2) excimer laser or extreme ultraviolet (EUV).

11. The method for forming a patterned photoresist as claimed in claim 5, wherein the developer solution comprises tetramethylammonium hydroxide (TMAH) solution or sodium hydroxide (NaOH) solution.

12. A method for forming an integrated circuit pattern, comprising:
providing a substrate;
forming a material layer on the substrate;
depositing a photoresist layer on the material layer, wherein the photoresist layer comprises a first polymer, of a second polymer, a solvent and a photo acid generator, wherein the second polymer is polytetrafluoroethylene (PTFE) and has an actual length, and a weight ratio of the second polymer to the first polymer is in a range from about 0.01% to about 5%;
exposing the photoresist layer to create a plurality of exposed regions and a plurality of unexposed regions, wherein the first polymer in the exposed regions is more soluble than the second polymer in the exposed regions in aqueous solution such that the first polymer in the exposed regions is removed while the second polymer in the exposed regions remains after developing the photoresist layer, and the first polymer has a higher etching resistance than the second polymer;
developing the photoresist layer to form a patterned photoresist, wherein the second polymer remaining in the exposed regions connects two adjacent unexposed regions such that mechanical strength of the two adjacent unexposed regions is increased, wherein the patterned photoresist has a plurality of patterns at the unexposed regions and a plurality of gaps at the exposed regions and the length of the second polymer is greater than a length of each gap; and
plasma etching to selectively remove the remaining second polymer in the exposed regions and portions of the material layer exposed by the gaps at the exposed regions.

13. The method for forming an integrated circuit pattern as claimed in claim 12, wherein developing the photoresist layer to form the patterned photoresist comprises:
developing the photoresist layer by applying a developer solution on the photoresist layer, wherein the first polymer is more soluble than the second polymer in the developer solution; and
rinsing the photoresist layer by applying a rinse solution on the photoresist layer.

14. The method for forming an integrated circuit pattern as claimed in claim 12, wherein exposing the photoresist layer to a predetermined pattern comprises:
utilizing Krypton Fluoride (KrF) excimer laser, Argon Fluoride (ArF) excimer laser, a fluorine (F2) excimer laser or extreme ultraviolet (EUV).

15. The method for forming an integrated circuit pattern as claimed in claim 12, further comprising:
removing the unexposed regions of the photoresist layer after the material layer is etched.

16. The method for forming an integrated circuit pattern as claimed in claim 12, wherein the first polymer comprises novolac resin, polyhydroxystyrene (PHS), poly(4-t-butoxycarbonyloxystyrene) (PBOCST), poly(2-methyl-2-adamantyl methacrylate-co-γ-butyrolactone methacrylate) (MAMA-GBLMA), or poly (norbornene fluoroalcohol-co-tetrafluoroethylene-co-tert butyl acrylate) (NB—F—OH-TFE-t-BuAc).

17. The method for forming an integrated circuit pattern as claimed in claim 12, wherein the first polymer has a first ring parameter, the second polymer has a second ring parameter, and the first ring parameter is larger than or equal to the second ring parameter.

18. The method for forming an integrated circuit pattern as claimed in claim 12, wherein the first polymer has a first Ohnishi parameter, the second polymer lass a second Ohnishi parameter, and the first Ohnishi parameter is smaller than or equal to the second Ohnishi parameter.

19. The method for forming an integrated circuit pattern as claimed in claim 12, wherein the solvent comprises heptanone, propylene glycol methyl ether acetate, ethyl lactate, or propylene glycol methyl ether.

20. The method for forming an integrated circuit pattern as claimed in claim 12, wherein the developer solution comprises tetramethylammonium hydroxide (TMAH) solution of sodium hydroxide (NaOH) solution.

* * * * *